(12) United States Patent
Iwamoto

(10) Patent No.: US 9,895,723 B2
(45) Date of Patent: Feb. 20, 2018

(54) GAS PURGE APPARATUS, LOAD PORT APPARATUS, INSTALLATION STAND FOR PURGING CONTAINER, AND GAS PURGE METHOD

(71) Applicant: TDK CORPORATION, Minato-ku, Tokyo (JP)

(72) Inventor: Tadamasa Iwamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/087,699

(22) Filed: Mar. 31, 2016

(65) Prior Publication Data

US 2017/0025298 A1    Jan. 26, 2017

(30) Foreign Application Priority Data

Mar. 31, 2015 (JP) ................ 2015-071659

(51) Int. Cl.
| | | |
|---|---|---|
| *B65B 31/00* | (2006.01) | |
| *B08B 5/00* | (2006.01) | |
| *H01L 21/67* | (2006.01) | |
| *H01L 21/673* | (2006.01) | |
| *H01L 21/677* | (2006.01) | |
| *B08B 9/00* | (2006.01) | |

(52) U.S. Cl.
CPC .......... *B08B 5/00* (2013.01); *H01L 21/67259* (2013.01); *H01L 21/67393* (2013.01); *H01L 21/67772* (2013.01); *H01L 21/67775* (2013.01); *B08B 9/00* (2013.01)

(58) Field of Classification Search
CPC .. H01L 21/67379; H01L 21/67389–21/67393; B65B 31/04–31/06; B08B 9/00
See application file for complete search history.

(56) References Cited

U.S. PATENT DOCUMENTS

| | | | | | |
|---|---|---|---|---|---|
| 4,682,927 | A | * | 7/1987 | Southworth ...... | H01L 21/67706 198/950 |
| 5,137,063 | A | * | 8/1992 | Foster ............... | H01L 21/67393 141/98 |
| 5,295,522 | A | * | 3/1994 | DeAngelis ........ | H01L 21/67376 141/286 |
| 5,351,415 | A | * | 10/1994 | Brooks ................. | F26B 21/003 141/85 |
| 5,388,944 | A | * | 2/1995 | Takanabe ............ | C23C 16/4401 118/719 |
| 5,451,131 | A | * | 9/1995 | Hecht ............... | H01L 21/67126 118/50 |

(Continued)

FOREIGN PATENT DOCUMENTS

| | | |
|---|---|---|
| JP | 2003-060007 A | 2/2003 |
| JP | 2011-187539 A | 9/2011 |

*Primary Examiner* — Paul R Durand
*Assistant Examiner* — Randall Gruby
(74) *Attorney, Agent, or Firm* — Arent Fox LLP

(57) ABSTRACT

In a gas purge apparatus, a load port apparatus, an installation stand for a purging container, and a gas purge method, the inside of the purging container is filled with a cleaning gas until just before transportation, and a placement failure does not happen to the next purging container to be placed. A purge nozzle is moved to a direction separating from a purge port after detecting a movement of a table on which the purging container is installed to an undock position and a stop of a feeding of the cleaning gas.

19 Claims, 11 Drawing Sheets

(56) References Cited

U.S. PATENT DOCUMENTS

| | | | | |
|---|---|---|---|---|
| 5,472,086 A * | 12/1995 | Holliday | H01L 21/67294 | 118/500 |
| 5,810,062 A * | 9/1998 | Bonora | H01L 21/67393 | 141/351 |
| 5,931,631 A * | 8/1999 | Bonora | H01L 21/67772 | 414/416.01 |
| 5,988,233 A * | 11/1999 | Fosnight | H01L 21/67393 | 141/63 |
| 6,032,704 A * | 3/2000 | Huang | H01L 21/67017 | 141/11 |
| 6,053,688 A * | 4/2000 | Cheng | H01L 21/67772 | 118/719 |
| 6,082,948 A * | 7/2000 | Fishkin | H01L 21/67757 | 414/217 |
| 6,138,721 A * | 10/2000 | Bonora | H01L 21/67775 | 141/231 |
| 6,199,604 B1 * | 3/2001 | Miyajima | H01L 21/67017 | 141/348 |
| 6,261,044 B1 * | 7/2001 | Fosnight | H01L 21/67772 | 414/217 |
| 6,419,438 B1 * | 7/2002 | Rosenquist | H01L 21/67775 | 414/217 |
| 6,501,070 B1 * | 12/2002 | Bacchi | H01L 21/67373 | 206/387.12 |
| 6,591,162 B1 * | 7/2003 | Martin | H01L 21/67242 | 700/225 |
| 6,609,876 B2 * | 8/2003 | Mages | H01L 21/67769 | 414/411 |
| 6,641,348 B1 * | 11/2003 | Schultz | H01L 21/67775 | 414/217 |
| 6,816,251 B2 * | 11/2004 | Swan | G01N 21/9506 | 250/559.36 |
| 6,817,822 B2 * | 11/2004 | Tokunaga | H01L 21/67772 | 414/217 |
| 6,896,470 B1 * | 5/2005 | Chen | H01L 21/67772 | 414/217 |
| 7,115,891 B2 * | 10/2006 | Komatsu | H01L 21/67259 | 250/559.4 |
| 7,350,544 B2 * | 4/2008 | Bernard | H01L 21/67017 | 141/11 |
| 7,455,180 B2 * | 11/2008 | Sumi | F16K 15/026 | 137/508 |
| 7,665,787 B2 * | 2/2010 | Obayashi | H01L 21/67766 | 294/103.1 |
| 8,444,125 B2 * | 5/2013 | Natsume | H01L 21/67775 | 141/98 |
| 8,591,809 B2 * | 11/2013 | Ra | H01L 21/67376 | 141/63 |
| 8,777,553 B2 * | 7/2014 | Hirano | H01L 21/67017 | 414/805 |
| 8,888,433 B2 * | 11/2014 | Gilchrist | H01L 21/67353 | 414/217.1 |
| 9,082,807 B2 * | 7/2015 | Sugawara | H01L 21/68735 | |
| 9,305,817 B2 * | 4/2016 | Kaise | H01L 21/67772 | |
| 9,406,537 B2 * | 8/2016 | Oyama | H01L 21/67373 | |
| 9,607,871 B2 * | 3/2017 | Iwamoto | H01L 21/67389 | |
| 2002/0044859 A1 * | 4/2002 | Lee | H01L 21/67775 | 414/411 |
| 2002/0051701 A1 * | 5/2002 | Saeki | H01L 21/67775 | 414/222.01 |
| 2003/0049101 A1 | 3/2003 | Seita | | |
| 2003/0221744 A1 * | 12/2003 | Hu | H01L 21/67393 | 141/59 |
| 2004/0013498 A1 * | 1/2004 | Soucy | H01L 21/67775 | 414/217 |
| 2004/0035493 A1 * | 2/2004 | Miyajima | H01L 21/67126 | 141/98 |
| 2004/0099333 A1 * | 5/2004 | Tsai | B08B 9/08 | 141/98 |
| 2005/0095098 A1 * | 5/2005 | Miyajima | H01L 21/67379 | 414/411 |
| 2005/0284535 A1 * | 12/2005 | Speasl | G03F 7/7075 | 141/1 |
| 2006/0120833 A1 * | 6/2006 | Bonora | H01L 21/67766 | 414/217 |
| 2006/0288664 A1 * | 12/2006 | Okabe | H01L 21/67393 | 53/510 |
| 2007/0210533 A1 * | 9/2007 | Okabe | F16J 15/002 | 277/628 |
| 2008/0112784 A1 * | 5/2008 | Rogers | H01L 21/67775 | 414/411 |
| 2008/0260498 A1 * | 10/2008 | Nagata | H01L 21/67017 | 414/217 |
| 2009/0035099 A1 * | 2/2009 | Okabe | H01L 21/67772 | 414/217 |
| 2009/0169342 A1 * | 7/2009 | Yoshimura | H01L 21/67775 | 414/217 |
| 2009/0175709 A1 * | 7/2009 | Okabe | H01L 21/67017 | 414/222.02 |
| 2009/0196714 A1 * | 8/2009 | Sylvestre | H01L 21/67383 | 414/217.1 |
| 2009/0297298 A1 * | 12/2009 | Okabe | H01L 21/67276 | 414/217.1 |
| 2011/0214778 A1 | 9/2011 | Natsume et al. | | |
| 2012/0096740 A1 * | 4/2012 | Naylor | F17D 1/04 | 34/562 |
| 2012/0309286 A1 * | 12/2012 | Nakano | H01L 21/67775 | 454/305 |
| 2013/0326841 A1 * | 12/2013 | Natsume | B08B 9/093 | 15/405 |
| 2014/0000757 A1 * | 1/2014 | Takahara | H01L 21/67769 | 141/8 |
| 2014/0157722 A1 * | 6/2014 | Iwamoto | H01L 21/67775 | 53/111 R |
| 2014/0305540 A1 * | 10/2014 | Oyama | H01L 21/67389 | 141/4 |
| 2015/0000785 A1 * | 1/2015 | Shin | F17C 5/007 | 141/4 |
| 2015/0024671 A1 * | 1/2015 | Taniyama | F24F 9/00 | 454/193 |
| 2015/0221538 A1 * | 8/2015 | Ochiai | H01L 21/67775 | 414/217 |
| 2016/0038982 A1 * | 2/2016 | Sasaki | H01L 21/67775 | 15/316.1 |
| 2016/0207082 A1 * | 7/2016 | Iwamoto | B08B 5/02 | |
| 2016/0260627 A1 * | 9/2016 | Nakano | H01L 21/67389 | |
| 2016/0260628 A1 * | 9/2016 | Ochiai | H01L 21/67772 | |
| 2016/0276188 A1 * | 9/2016 | Morihana | H01L 21/67393 | |
| 2017/0025297 A1 * | 1/2017 | Kudo | H01L 21/67389 | |
| 2017/0025299 A1 * | 1/2017 | Sasaki | B08B 9/08 | |

* cited by examiner

GAS PURGE APPARATUS, LOAD PORT APPARATUS, INSTALLATION STAND FOR PURGING CONTAINER, AND GAS PURGE METHOD

CROSS-REFERENCE TO RELATED APPLICATION

This application claims the priority of Japanese Patent Application No. 2015-071659, filed on Mar. 31, 2015.

BACKGROUND OF THE INVENTION

1. Field of the Invention

The present invention relates to a gas purge apparatus, a load port apparatus, an installation stand for purging container, and a gas purge method.

2. Description of the Related Art

For example, manufacturing process of semiconductors includes the following technique (bottom purge): a gas purge nozzle is arranged on an installation stand of a load port apparatus and is made contact with a gas purge port provided at a bottom part of a wafer transport container to introduce a purge gas therethrough and clean the inner atmosphere of the wafer transport container by the purge gas.

Upon performing the bottom purge, the purge nozzle is moved toward the purge port to be in contact with the gas purge port provided at the bottom part of the wafer transport container (e.g., see Patent Document 1). Preferably, the bottom purge is performed until just before the wafer transport container is transported from the load port apparatus. This is because the cleanliness of inside of the container is gradually decreased after the transportation.

However, when the purge nozzle is left while it is protruding from the installation stand after the wafer transport container is transported, a placement failure may be caused at the time of arrival of the next wafer transport container to be processed.

Patent Document 1: Japanese Patent Laid-Open No. 2003-60007

SUMMARY OF THE INVENTION

The present invention has been achieved in consideration of the circumstances. It is an object of the invention to provide a gas purge apparatus, a load port apparatus, an installation stand for purging container, and a gas purge method filling inside of a purging container with a cleaning gas until just before transportation and preventing a placement failure from generating to the next purging container to be placed.

To achieve the above object, the gas purge apparatus according to the present invention is capable of blowing a cleaning gas into a purging container with a purge port therethrough, and comprises:

a purge nozzle with a nozzle opening blowing out the cleaning gas;

a table on which the purging container is detachably placed;

a fixing mechanism capable of fixing the purging container to prevent it from moving relatively on the table and releasing this fixing;

a nozzle driving mechanism capable of moving the purge nozzle toward the purge port and moving the purge nozzle toward a direction separating from the purge port;

a table moving mechanism configured to move the table on which the purging container is placed to an undock position;

a gas feeding mechanism configured to control an operation for feeding the cleaning gas into the purging container and an operation for stopping the feeding of the cleaning gas through the purge nozzle and the purge port; and a control means configured to control the nozzle driving mechanism to move the purge nozzle toward the direction separating from the purge port after detecting a movement of the table to the undock position and a stop of the feeding of the cleaning gas by the gas feeding mechanism.

A gas purge method according to the present invention is for blowing a cleaning gas into a purging container with a purge port therethrough, and comprises the steps of:

blowing out the cleaning gas into the purging container by bringing a nozzle opening of a purge nozzle into contact with the purge port;

moving the purging container to an undock position; and moving the purge nozzle toward a direction separating from the purge port after detecting a movement of the purging container to the undock position and a stop of a feeding of the cleaning gas into the purging container.

In the gas purge apparatus and the gas purge method according to the present invention, the purge nozzle is moved toward the direction separating from the purge port after detecting the movement of the purging container to the undock position and the stop of the feeding of the cleaning gas into the purging container. Thus, the inside of the purging container can be filled with the cleaning gas until just before the transportation. Further, the purge nozzle is securely drawn into the table at the arrival of the next purging container to be placed, and thus a placement failure does not happen to the next purging container to be placed.

In the first aspect of the present invention, the control means controls the nozzle driving mechanism to move the purge nozzle toward the direction separating from the purge port, provided that the control means receives a detection signal showing the release of the fixing of the purging container by the fixing mechanism and detects the stop of the feeding of the cleaning gas by the gas feeding mechanism. According to the first aspect of the present invention, the purging can be continued until just before nozzle falling, and thus the inside of the purging container can be kept clean.

In the second aspect of the present invention, the control means controls the nozzle driving mechanism to move the purge nozzle toward the direction separating from the purge port, provided that the control means detects the stop of the feeding of the cleaning gas by the gas feeding mechanism and receives a detection signal showing the release of the fixing of the purging container by the fixing mechanism. In the second aspect of the present invention, the fixing is released immediately after stopping the purging, and thus the purging container can be quickly transported to the next step. Also, the purging is stopped at the time of releasing the fixing, and thus the risk of the cleaning gas leak can be minimized.

In the third aspect of the present invention, the control means controls the fixing mechanism to release the fixing of the purging container after controlling the nozzle driving mechanism to move the purge nozzle toward the direction separating from the purge port. In the third aspect of the present invention, the fixing is released at the end, and thus the purging container can be prevented from leaning in the separation step of the purging container. Note that, when the fixing is released with the purge nozzle escalated, the nozzle may be further escalated due to reaction of the release of the fixing, and the wafer transport container may be vibrated up and down.

Preferably, the purge nozzle and the purge port are connected by moving the purge nozzle toward the purge port after the purging container is fixed on the table. This prevents the purge nozzle from pushing up the container, and a placement failure hardly happens to the container.

Also, there is no risk that the container leans, and handling performance of wafers or so housed in the container is hardly adversely affected. Also, the purge port and the purge nozzle are sufficiently in contact with, which hardly causes gas leak and prevents outside gas from flowing into the purging container.

The fixing mechanism of the present invention is not limited and includes an upper holding mechanism holding the purging container toward the table from above, a side holding mechanism engaging with a side lower part of the purging container, or the like.

Preferably, the fixing mechanism is a clamp mechanism detachably engaging with the purging container. Preferably, the clamp mechanism is provided to be relatively movable to the table and detachably engaged with a bottom of the purging container.

When the purging container is placed on the table, the clamp mechanism is not obstacle compared with the upper holding mechanism. Also, the side holding mechanism needs to arrange at least a pair of holding mechanisms and thus has a large-scale apparatus. On the other hand, a bottom clamp mechanism engaging with the bottom can perform fixing by arranging only one holding mechanism, which contributes to downsizing of the apparatus.

Preferably, the gas purge apparatus according to the present invention further comprises a position detecting sensor for detecting whether the purging container is placed at a predetermined position on the table, wherein the control means drives the fixing mechanism to fix the purging container on the table based on a normal position detecting signal detected by the position detecting sensor showing that the purging container is placed at the predetermined position on the table.

An operation for fixing the container on the table is securely performed by detecting the fact that the purging container is at a normal position on the table and then fixing the container on the table. Note that, when the container is not at a normal position on the table, the control means may generate an alarm or so.

Preferably, the gas purge apparatus according to the present invention further comprises a load presence sensor configured to detect whether the purging container is on the table, wherein the control means confirms a detection signal from the position detecting sensor based on a load presence signal detected by the load presence sensor showing that the purging container is on the table.

When the control means determines that the purging container is not on the table based on the detection signal from the load presence sensor, there is no need to check the detection signal from the position detecting sensor, malfunction can be prevented, and energy saving can be achieved.

A load port apparatus according to the present invention comprises any of the gas purge apparatuses mentioned above. Also, an installation stand for the purging container according to the present invention comprises any of the gas purge apparatuses.

DESCRIPTION OF THE PREFERRED EMBODIMENTS

Figure 1:
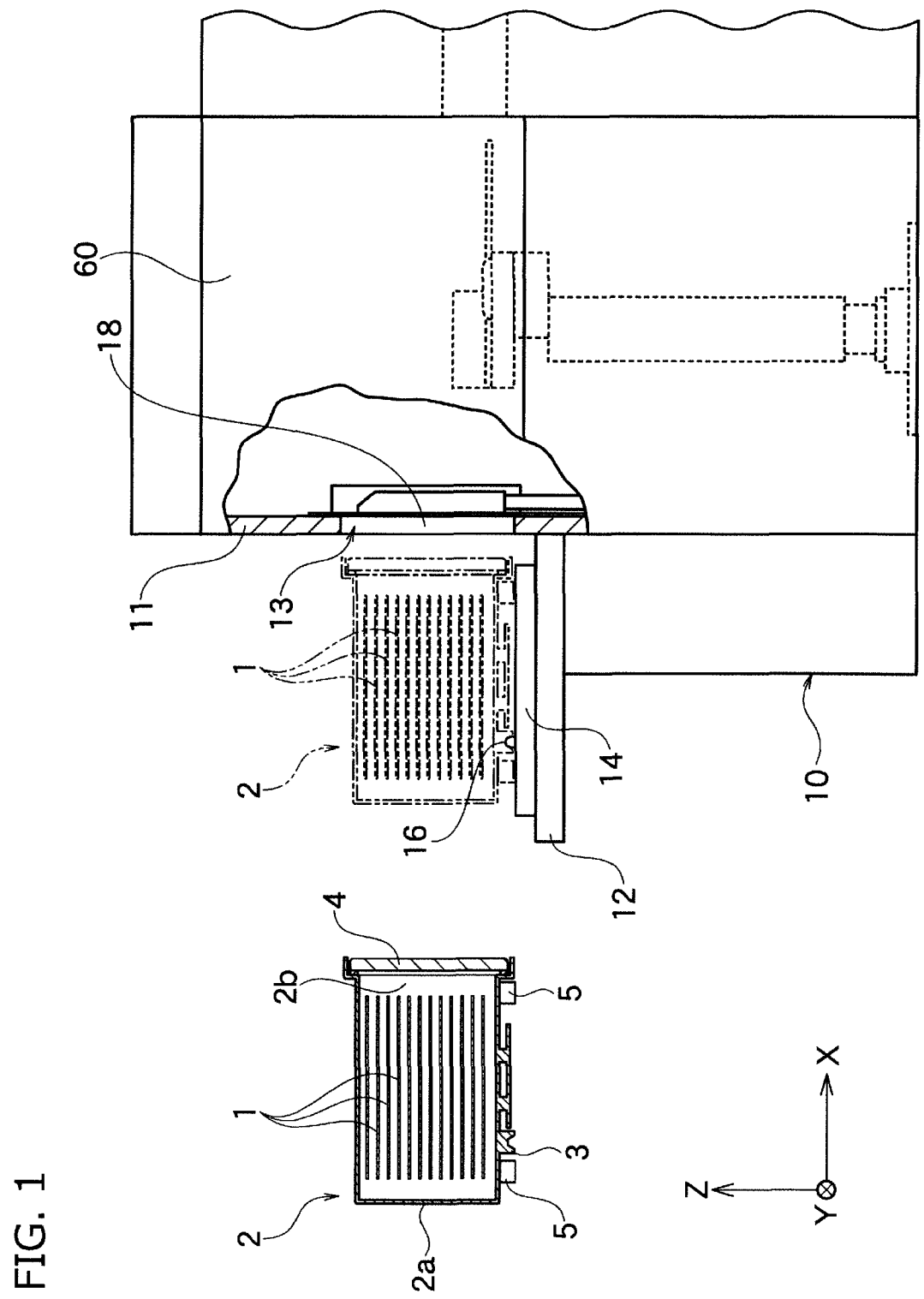
FIG. 1 is a schematic view of a load port apparatus to which a gas purge unit according to one embodiment of the present invention is applied.

Hereinafter, the present invention will be explained based on embodiments shown in the figures.
First Embodiment As shown in FIG. 1, a load port apparatus 10 according to one embodiment of the present invention is connected to a semiconductor processing apparatus 60. The load port apparatus 10 has an installation stand 12 and a movable table 14. The table 14 is movable in the X-axis direction on the installation stand 12. Note that, in the figures, the X-axis represents a moving direction of the table 14, the Z-axis represents a vertical direction, and the Y-axis represents a direction vertical to the X-axis and the Z-axis.

A sealed transport container 2 can be detachably placed on a top in the Z-axis direction of the table 14. The container 2 is made of a pot, a FOUP, or the like for transporting a plurality of wafers 1 while they are sealed and stored. The container 2 houses a casing 2a. A space for housing the wafers 1 to be processed is formed in the casing 2a. The casing 2a has an approximately box shape where an opening is formed on one of its surfaces in the horizontal direction. Note that, the casing 2a has a bottom that is similar to a plane shape of the table 14 shown in FIG. 2.

Also, the container 2 has a lid 4 for sealing an opening 2b of the casing 2a. Shelves (not shown) for vertically overlapping the wafers 1 held horizontally are arranged in the casing 2a. Each of the wafers 1 placed on the shelves is housed in the container 2 at regular intervals.

The load port apparatus 10 is an interface device for transporting the wafers 1 housed in a sealed state in the container 2 into the semiconductor processing apparatus 60 while maintaining a clean condition. The load port apparatus 10 has a door 18 opening and closing a delivery port 13 of a wall member 11. The wall member 11 is configured to function as part of a casing for sealing inside of the semiconductor processing apparatus 60 in a clean condition, or as part of a casing for sealing inside of an apparatus such as an EFEM connecting the semiconductor processing apparatus 60 and the load port apparatus 10 in a clean condition. The movement of the door 18 will be briefly explained with reference to FIG. 5A to FIG. 5D.

Figure 5A:
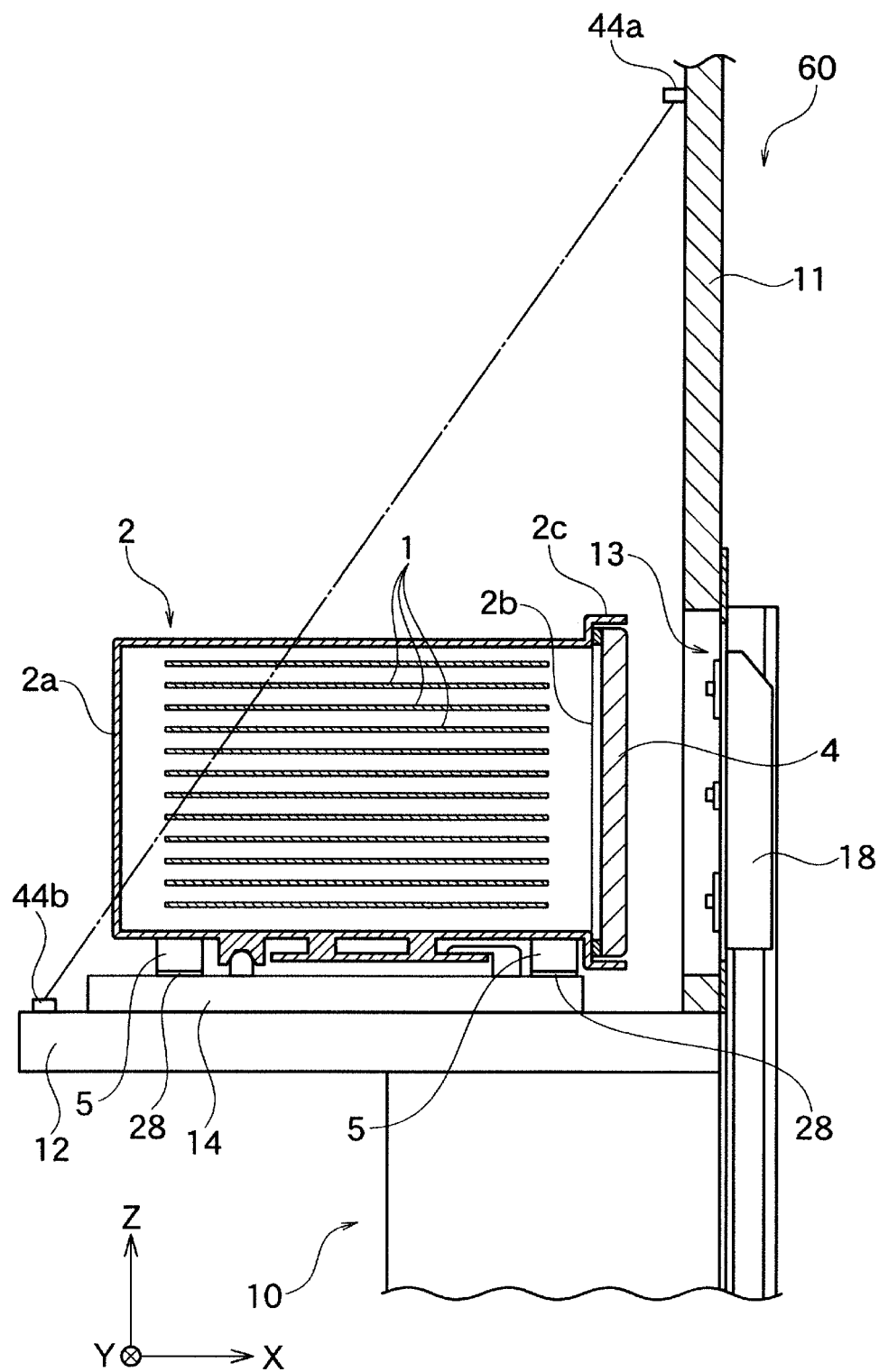
FIG. 5A is a schematic cross section showing an example of load presence sensors.
Figure 5B:
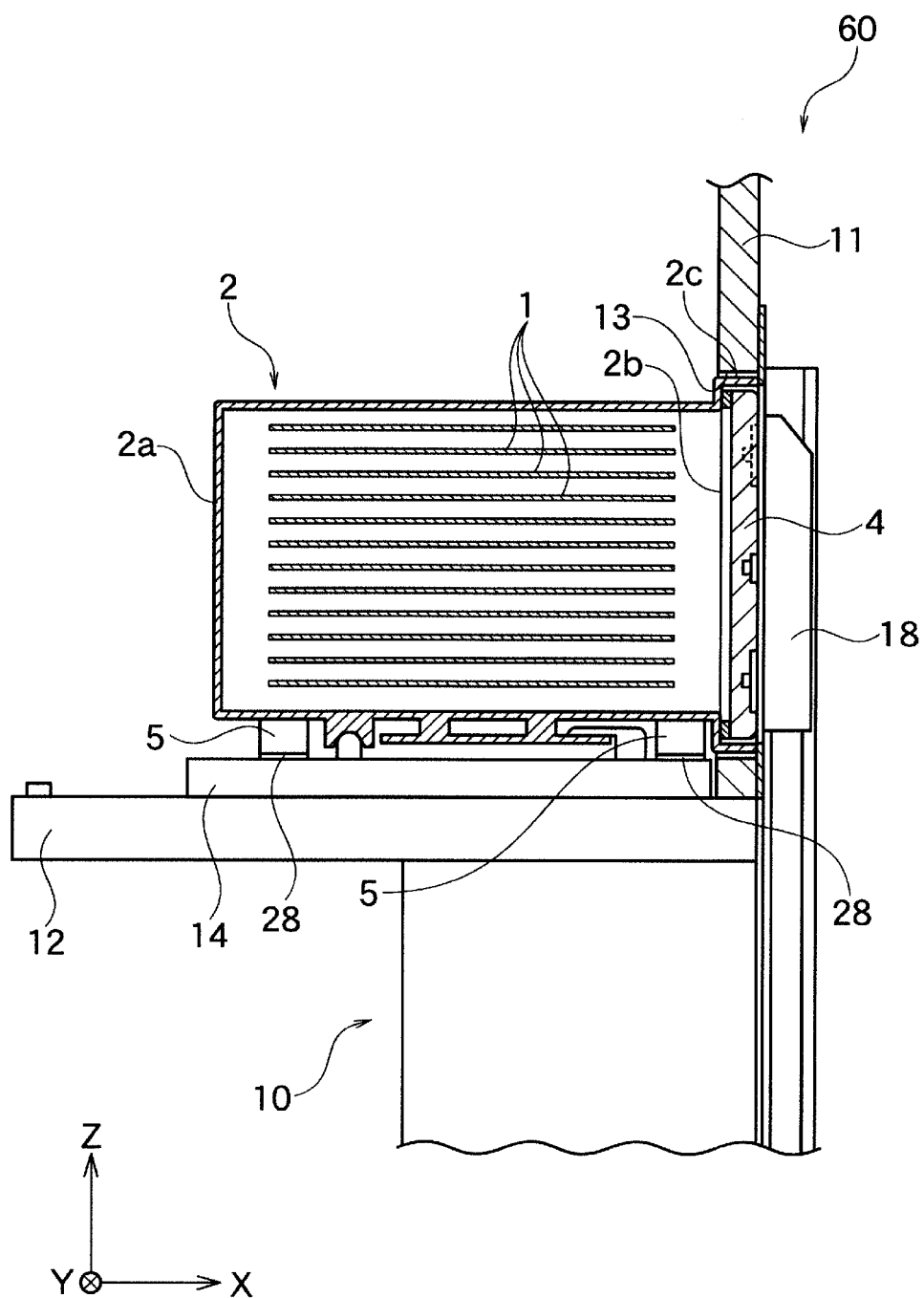
FIG. 5B is a schematic view showing a step where a door of a FOUP is opened by a load port apparatus.

As shown in FIG. 5A, when the container 2 is installed on the table 14, a bottom gas purge by purge ports 5 and purge nozzles 28 is performed based on control mentioned below. Then, as shown in FIG. 5B, under a condition that the bottom gas purge is being performed, the table 14 is moved in the X-axis direction by a table moving mechanism not shown, and an opening edge 2c with the lid 4 airtightly sealing the opening 2b of the container 2 enters the delivery port 13 of the wall member 11.

Figure 5C:
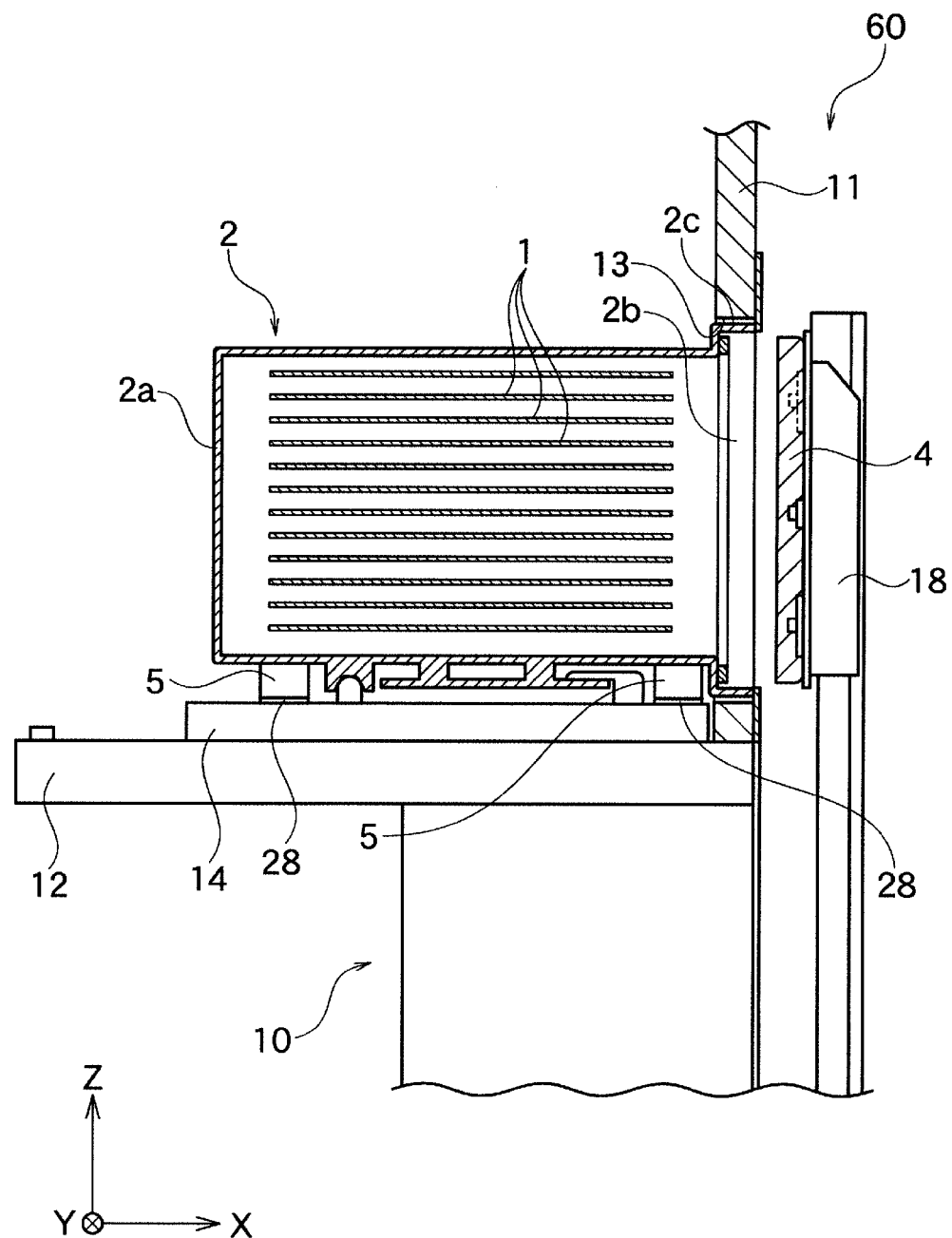
FIG. 5C is a schematic view showing the following step of FIG. 5B.

At the same time, the door 18 located inside of the wall 11 (opposite side to the table 14) is engaged with the lid 4 of the container 2. At that time, a space between the opening edge 2c and an opening edge of the delivery port 13 is sealed by gasket or so, and the space is sealed in a good condition. Thereafter, as shown in FIG. 5C, the container 2 and the wall 11 are internally connected by moving the door 18 together with the lid 4 in parallel along the X-axis direction or moving them rotationally, detaching the lid 4 from the opening edge 2c, and opening the opening 2b. At that time, the bottom gas purge may be continuously operated, or in addition to the bottom purge, a purge gas (cleaning gas), including nitrogen gas or other inert gas, may blow out from the inside of the wall 11 into the container 2 (front purge).

Figure 5D:
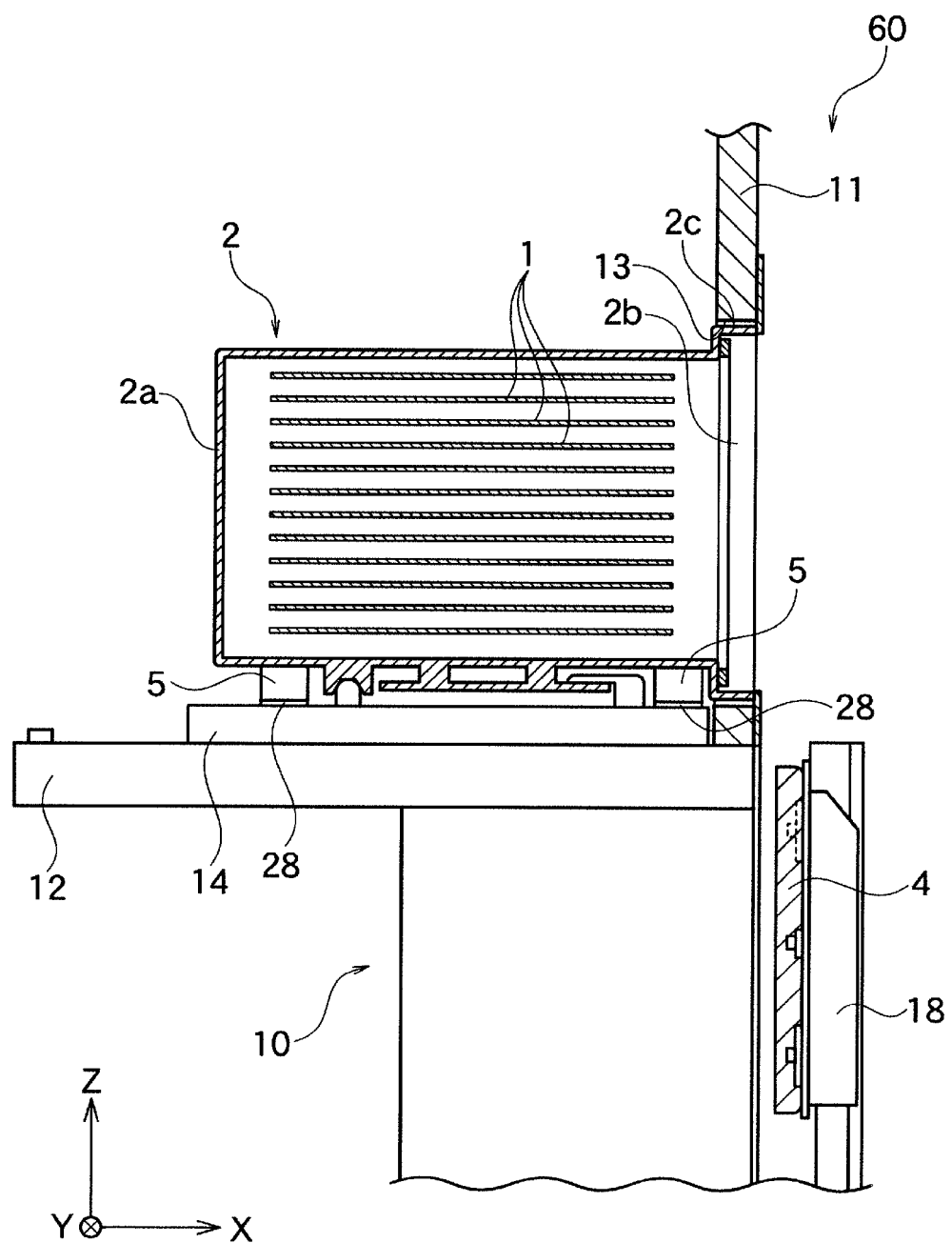
FIG. 5D is a schematic view showing the following step of FIG. 5C.

Next, as shown in FIG. 5D, when the door 18 is moved downward in the Z-axis in the wall 11, the opening 2b of the container 2 is completely opened to the inside of the wall 11, and the wafers 1 are delivered into the wall 11 through the opening 2b by such as a robot hand arranged inside of the wall 11. At that time, the container 2 and the wall 11 are internally cut off from the outside air, and the bottom purge and/or the front purge may be continuously operated to maintain a clean environment within the container 2. An operation opposite to the above may be carried out to return the wafers 1 to the inside of the container 2 and detach it from the table 14.

Figure 2:
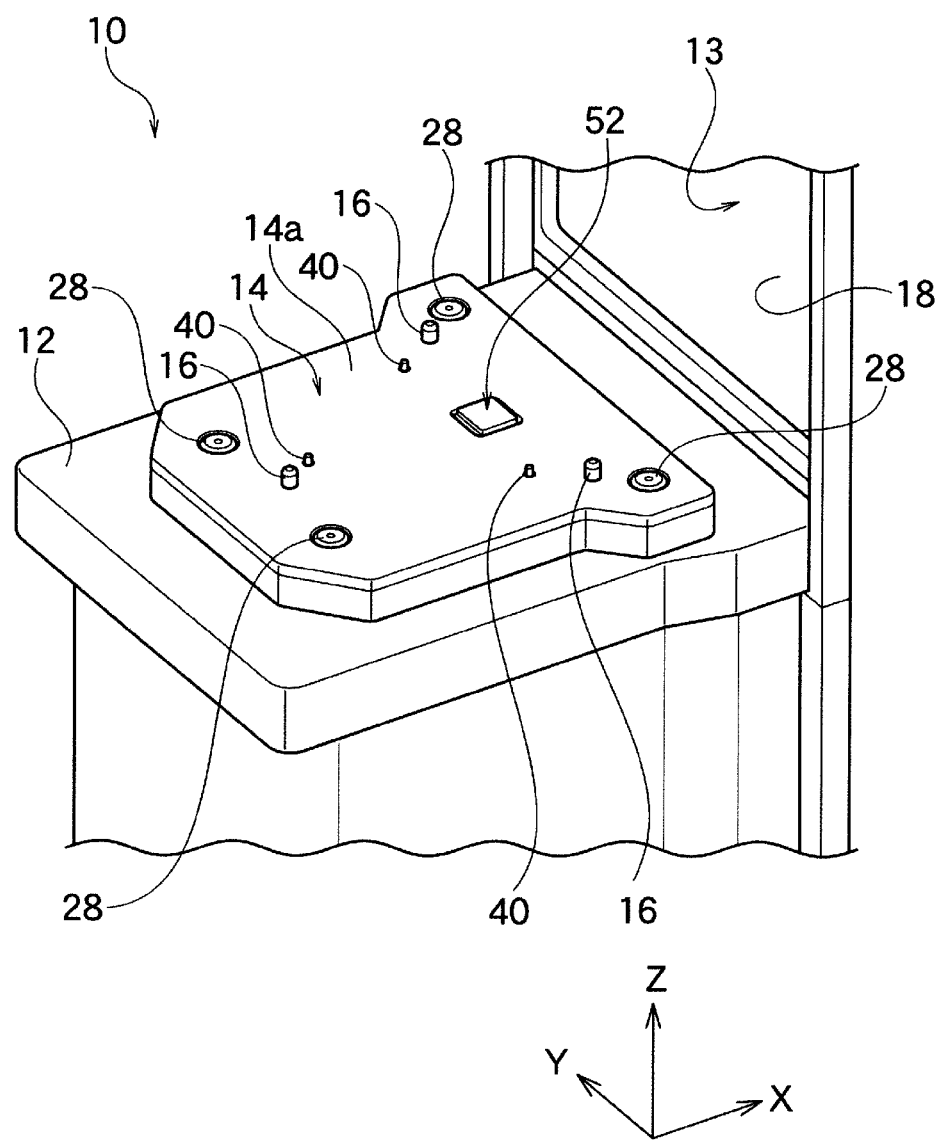
FIG. 2 is a perspective view of a main part showing a vicinity of a table of the load port apparatus shown in FIG. 1.

As shown in FIG. 2, one or more (preferably three) positioning pins 16 are embedded on a top surface 14a of the table 14 and engaged with concave parts of the positioning portion 3 arranged on the bottom of the casing 2a. This uniquely determines a positional relation of the X-axis and the Y-axis between the container 2 and the table 14.

Also, position detecting sensors 40 are arranged near the respective positioning pins 16 on the top surface 14a of the table 14. The position detecting sensors 40 detect whether the container 2 is positioned at a predetermined position in the X-Y axis direction of the top surface 14a of the table 14. Any sensor can be used as the position detecting sensor 40, and a contact type position detecting sensor or a non-contact type position detecting sensor may be used.

The contact type position detecting sensor includes an electric detecting sensor whose switch is turned on by being in contact with part of the bottom of the container 2. Also, the non-contact type position detecting sensor includes a light detecting sensor and a magnetic force detecting sensor. In either case, detection signals detected by the position detecting sensors 40 are inputted to a control means 80 shown in FIG. 3A. The control means 80 consists of a control circuit, such as IC chip.

As shown in FIG. 2, heads of the purge nozzles 28 are further exposed on the top surface 14a of the table 14. In this embodiment, the purge nozzles 28 are arranged at four places. Two purge nozzles 28 arranged near the door 18 are for discharge, and the other two purge nozzles 28 are for supply. The number of the purge nozzles 28 and their arrangement are not limited. Each of the purge nozzles 28 is attached to gas purge units 20 with a nozzle driving mechanism shown in FIG. 3A and FIG. 4A.

Figure 4A:
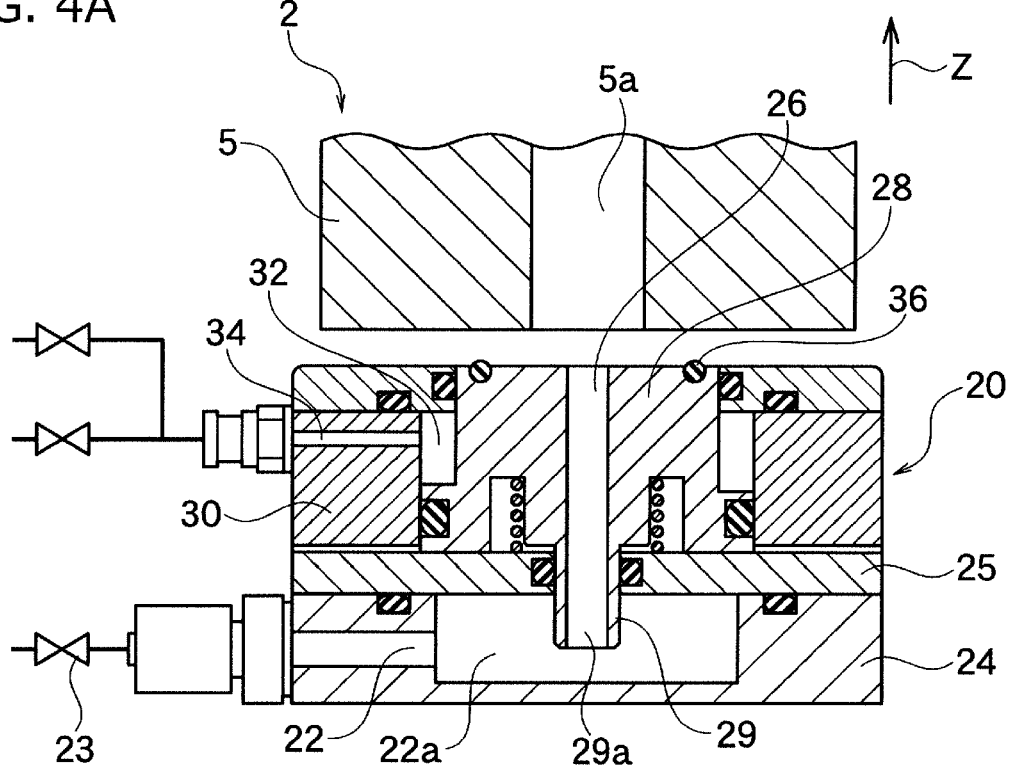
FIG. 4A is a schematic cross section showing a nozzle driving mechanism for moving the purge nozzle shown in FIG. 3A to FIG. 3C.
Figure 4B:
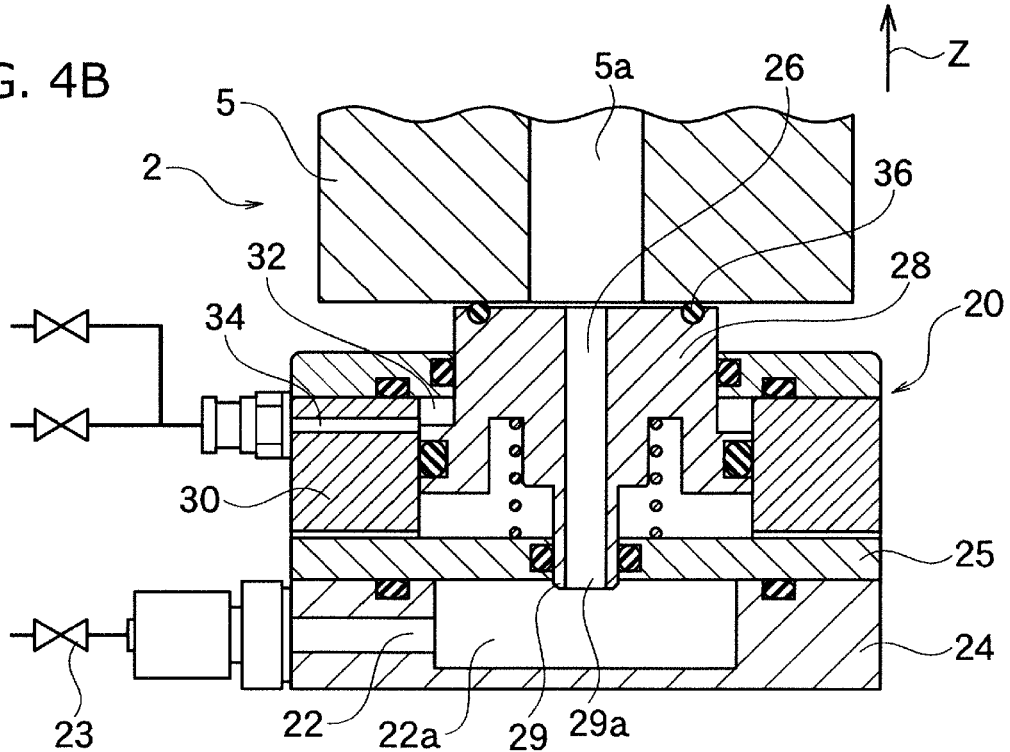
FIG. 4B is a schematic cross section showing a movement of a purge nozzle.

The gas purge units 20 include one for supply and one for discharge, but both of these just have a purging gas flow opposite to each other and have the same structure, such as one shown in FIG. 4A and FIG. 4B. Hereinafter, the gas purge unit 20 for supply will be explained based on FIG. 4A and FIG. 4B, but the gas purge unit for discharge will not be explained, since it is just different from the gas purge unit 20 for supply in terms of discharge/supply and has the same structure thereas.

As shown in FIG. 4A and FIG. 4B, the gas purge unit 20 has a supply member 24 with a supply passage 22 for supplying a cleaning gas, such as nitrogen gas and other inert gas. A cylinder 30 is fixed above in the Z-axis direction of the supply member 24 through a partition plate 25. The piston-type purge nozzle 28 is housed in the cylinder 30 to be capable of relatively moving in the Z-axis direction.

A piston chamber 32 is formed between the piston-type purge nozzle 28 and the cylinder 30. A pressure fluid, such as oil, is introduced to the piston chamber 32 or discharged therefrom through a passage 34, and thus the purge nozzle 28 can be moved up and down in the Z-axis direction relatively to the cylinder 30.

FIG. 4A shows a state where the purge nozzle 28 is moved to the lowermost position in the Z-axis direction, and FIG. 4B shows a state where the purge nozzle 28 is moved to the uppermost position in the Z-axis direction. In the state of FIG. 4A, the head (top portion) in the Z-axis direction of the purge nozzle 28 is flush with the top surface 14a of the table 14 or dented as shown in FIG. 2.

In the state of FIG. 4B, the head of the purge nozzle 28 is popped upward in the Z-axis direction from the top surface 14a of the table 14 shown in FIG. 2, and is closely in contact with the bottom surface of the purge port 5 formed on the bottom of the container 2 shown in FIG. 4B. The head of the purge nozzle 28 is equipped with a seal member 36, such as O-ring, and thus a nozzle opening 26 of the purge nozzle 28 and a purge opening 5a of the purge port 5 are connected airtightly.

A communication nozzle 29 is formed at the end in the Z-axis direction of the purge nozzle 28. A communication opening 29a of the communication nozzle 29 is configured to be in connect with a space 22a of the supply passage 22 regardless of the movement in the Z-axis direction of the purge nozzle 28. The supply passage 22 is equipped with a control valve (an example of a gas feeding mechanism) 23, for example. The control valve 23 is controlled by the control means 80 shown in FIG. 3A, which makes it possible to flow a cleaning gas into the supply passage 22 and stop the gas feeding.

In the state of FIG. 4B, the purge opening 5a of the purge port 5 is connected to the nozzle opening 26 of the nozzle 28, and the communication opening 29a connecting to the nozzle opening 26 is connected to the space 22a of the supply passage 22. As a result, a bottom purge is performed in such a manner that the cleaning gas is introduced into the container 2 shown in FIG. 5A through the purge openings 5a of the purge ports 5, and that the cleaning gas is discharged from the other purge ports 5. An operation opposite to the above may be performed to stop the bottom purge. The purge units 20 shown in FIG. 4A and FIG. 4B are controlled by the control means 80 shown in FIG. 3A.

As shown in FIG. 2, a head of a hook 52 is exposed in the central area along the Y-axis of the table 14 on the top surface 14a of the table 14. In the state of FIG. 2, the head of the hook 52 is substantially flush with the top surface 14a of the table 14. In this embodiment, the hook 52 is arranged near the door 18 on the top surface 14a of the table 14 (front retaining mechanism), but may be arranged in the substantially central area in the X-axis direction of the table 14 (center retaining mechanism).

Figure 3A:
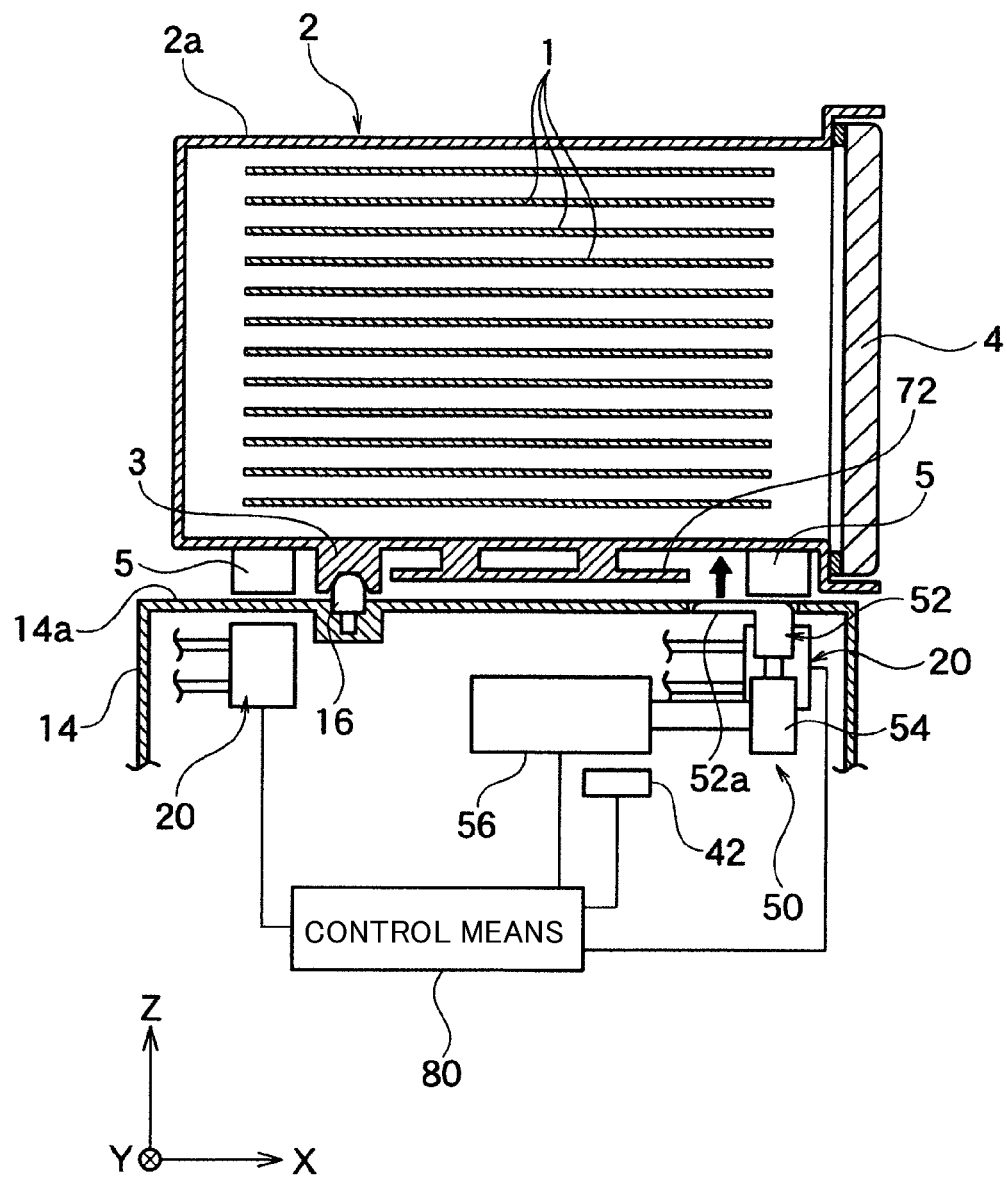
FIG. 3A is a schematic cross section of a gas purge apparatus assembled in the load port apparatus shown in FIG. 1 and FIG. 2.

As shown in FIG. 3A, the hook 52 is part of the clamp mechanism 50. The clamp mechanism 50 according to the present embodiment has a Z-axis direction driving mechanism 54 and a X-axis direction driving mechanism 56. The Z-axis direction driving mechanism 54 moves the hook 52 up and down in the Z-axis direction. The X-axis direction driving mechanism 56 moves the hook 52 forward and backward in the X-axis direction. The clamp mechanism 50 is controlled by the control means 80.

Figure 3B:
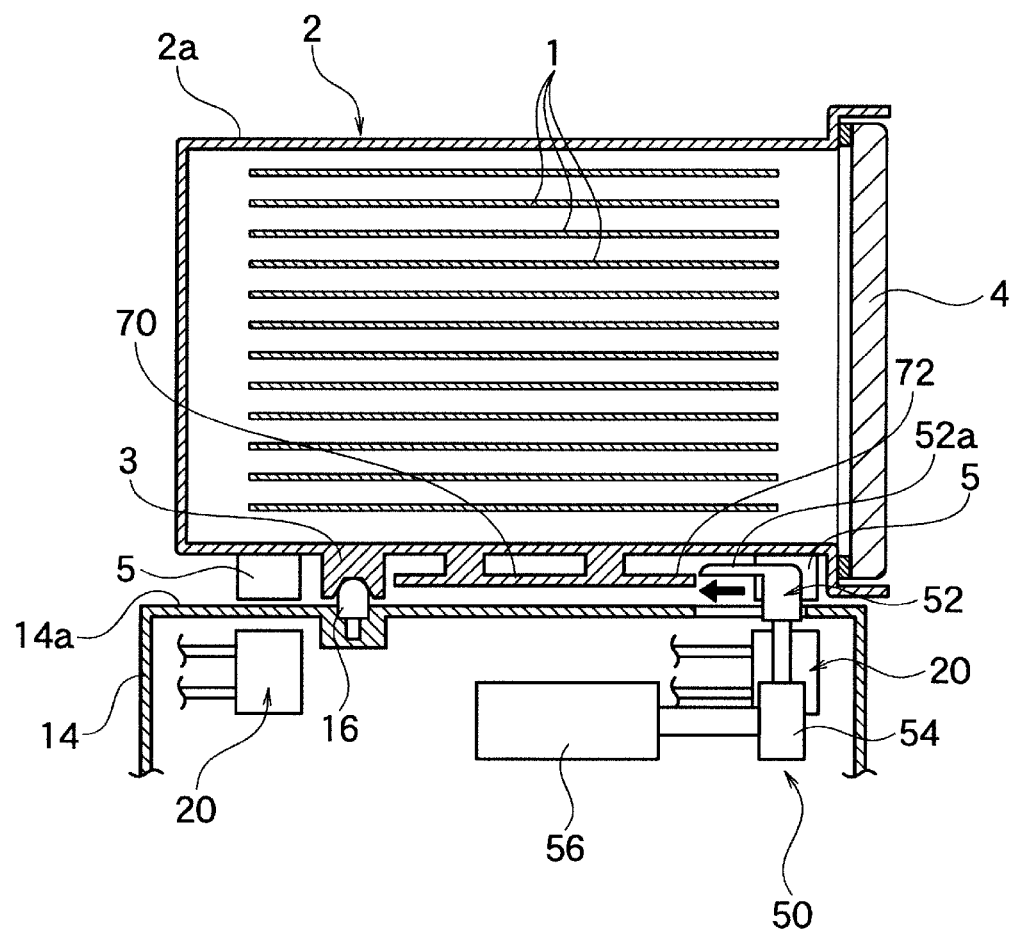
FIG. 3B is a schematic cross section showing a movement of a clamp mechanism of the gas purge apparatus shown in FIG. 3A.

For example, in the state of FIG. 3A, the hook 52 is drawn into the table 14 by the clamp mechanism 50 controlled by the control means 80, and the head of the hook 52 is flush with the top surface 14a of the table 14. When the control means 80 transmits a control signal, the Z-axis driving mechanism 54 is driven, and the hook 52 pops upward from the top surface 14a of the table 14, as shown in FIG. 3B.

Figure 3C:
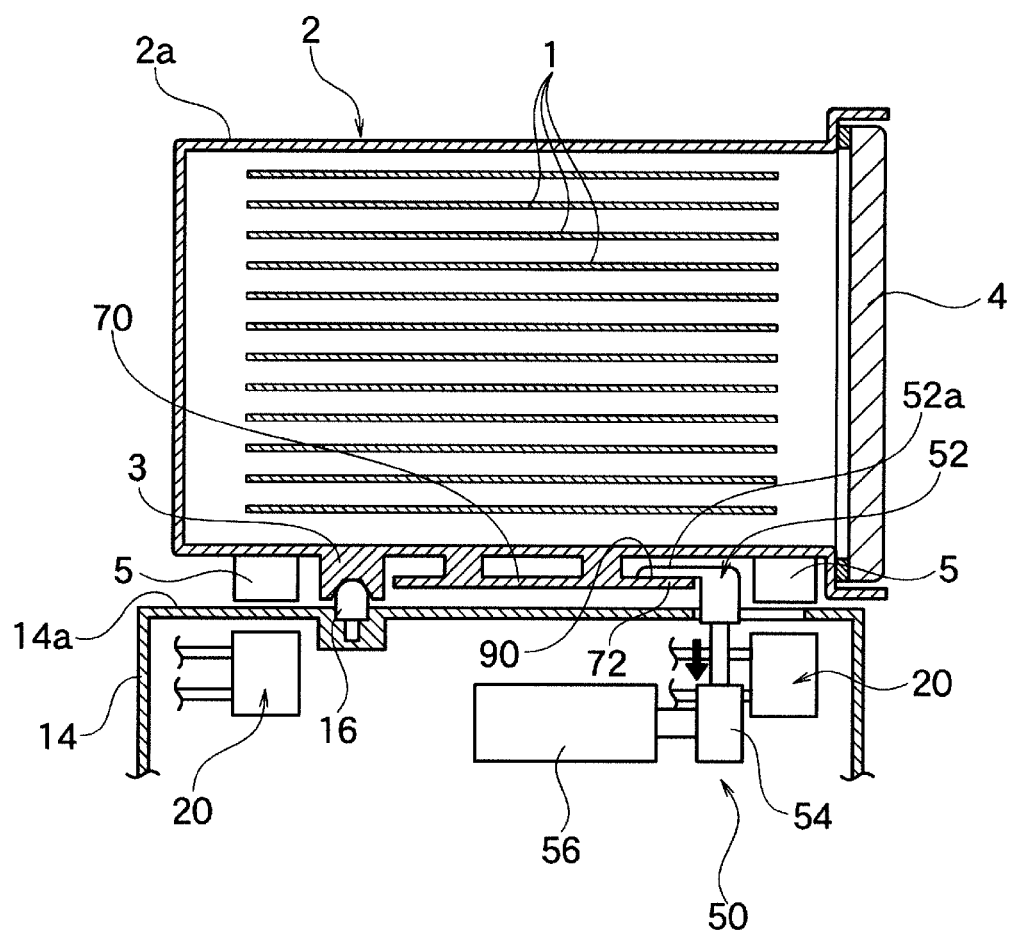
FIG. 3C is a schematic cross section showing the following movement of the clamp mechanism in FIG. 3B.

For example, the bottom of the container 2 is equipped with a bottom plate 70. In the vicinity of the lid 4, an engagement end edge 72 is formed on the bottom plate 70. As shown in FIG. 3C, after the hook 52 is popped upward in the Z-axis direction from the top surface 14a of the table 14, the control means 80 drives the X-axis direction driving mechanism 56, and an engagement convex part 52a of the hook 52 is positioned on a top of the engagement end edge 72.

Thereafter, the control means 80 drives the Z-axis direction driving mechanism 54 to move the hook 52 downward in the Z-axis direction, strongly engage the engagement convex part 52a of the hook 52 with the top of the engagement end edge 72, and fix the container 2 on the top surface 14a of the table 14. The container 2 is restricted to move in the X-axis direction, the Y-axis direction, and the Z-axis direction with respect to the table 14.

In the present embodiment, as shown in FIG. 3A, the clamp mechanism 50 is equipped with a fixing detection sensor 42. The fixing detection sensor 42 detects whether the container 2 is actually fixed on the table 14, and this detection signal is inputted to the control means 80. Any sensor can be used for the fixing detection sensor 42, and a contact type sensor or a non-contact type sensor may be used.

As shown in FIG. 3C, for example, the fixing detection sensor 42 can detect whether the container 2 is restricted to move in the X-axis direction, the Y-axis direction, and the Z-axis direction with respect to the table 14.

Note that, in the figures, the purge ports 5, the positioning pins 16, the hook 52, and the like are illustrated in an enlarged manner compared with the container 2 for easy understanding, but are different from actual dimension ratio.

In the present embodiment, as shown in FIG. 5A, the load port apparatus 10 is equipped with load presence sensors 44a and 44b. For example, the load presence sensors 44a and 44b consist of light sensors (light emitting element and light receiving element) and can detect whether the container 2 is on the table 14 at an undock position. The undock position is where the container 2 is transported onto the table 14 and where the container 2 is moved from the table 14 to another place.

Note that, the load presence sensors 44a and 44b are not necessarily non-contact type sensors, such as light sensor, and may be contact type sensors, such as limit switch. Detection signals of the load presence sensors 44a and 44b can be inputted to the control means 80 shown in FIG. 3A.

During storage and transportation of the wafers 1, the inside of the container 2 is sealed, and a clean environment is maintained in the vicinity of the wafers 1. At the undock position, when the container 2 is transported onto the top surface 14a of the table 14, the control means 80 shown in FIG. 3A firstly detects whether the container 2 is on the table 14 based on the detection signals from the load presence sensors 44a and 44b shown in FIG. 5A. Without the detection, the following control step will not be carried out.

When the control means 80 detects the fact that the container 2 is on the table 14 based on the detection signals from the load presence sensors 44a and 44b, the control means 80 then determines whether the container 2 is placed at a predetermined position on the table 14 by the position detecting sensors 40 shown in FIG. 2. When determining that the container 2 is placed at a predetermined position on the table 14 based on the detection signals from the position detecting sensors 40, the control means 80 controls the clamp mechanism 50 as a fixing mechanism to perform the operations shown in FIG. 3A to FIG. 3C as mentioned above and fix the container 2 on the table 14.

Next, the control means 80 shown in FIG. 3A receives the detection signal from the fixing detection sensor 42 and determines whether the container 2 is securely fixed on the table 14. When determining that the container 2 is securely fixed, the control means 80 then drives and controls the gas purge unit 20 with the nozzle driving mechanism to move the purge nozzles 28 as shown in FIG. 4A and FIG. 4B as mentioned above. That is, the purge nozzles 28 are moved toward the purge ports 5 to be in contact therewith, and the above-mentioned bottom purge is performed. This prevents the purge nozzles 28 from pushing up the container 2, and a placement failure hardly happens to the container 2.

Also, there is no risk that the container 2 leans, and handling performance of the wafers 1 or so housed in the container 2 is hardly adversely affected. Also, the purge ports 5 and the purge nozzles 28 are sufficiently in contact with, which hardly causes gas leak and prevents outside gas from flowing into the container 2 during the bottom purge.

Further, when the container 2 is placed on the table, the clamp mechanism 50 according to the present embodiment is not obstacle, compared with an upper holding mechanism that holds the container 2 from above. Also, a side holding mechanism needs to arrange at least a pair of holding mechanisms and thus has a large-scale apparatus. On the other hand, the clamp mechanism 50 according to the present embodiment can perform fixing by arranging only one holding mechanism, which contributes to downsizing of the apparatus.

Further, in the present embodiment, an operation for fixing the container 2 on the table 14 is securely performed by detecting the fact that the container 2 is at a normal position on the table 14 using the position detecting sensors 40 shown in FIG. 2 and then fixing the container 2 on the table 14. Note that, when the container 2 is not at a normal position on the table 14, the control means 80 may generate an alarm or so.

Further, in the present embodiment, when the control means 80 determines that the container 2 is not on the table 14 based on the detection signals from the load presence sensors 44*a* and 44*b* shown in FIG. 5A, there is no need to check the detection signals from the position detecting sensors 40, malfunction can be prevented, and energy saving can be achieved.

Next, the bottom purge is terminated based on the control means 80 shown in FIG. 3A, and a method for moving the container 2 from the undock position on the table 14 to another place will be explained.

The control means 80 shown in FIG. 3A controls a table moving mechanism not illustrated to return the container 2 housing a plurality of the processed wafers 1 to the undock position together with the table 14 as shown in FIG. 5A. The control means 80 shown in FIG. 3A detects the fact that the table 14 is moved to the undock position based on the detection signals from the load presence sensors 44*a* and 44*b* or the detection signal from the table moving mechanism (Step S2 shown in FIG. 6A).

Figure 6C:
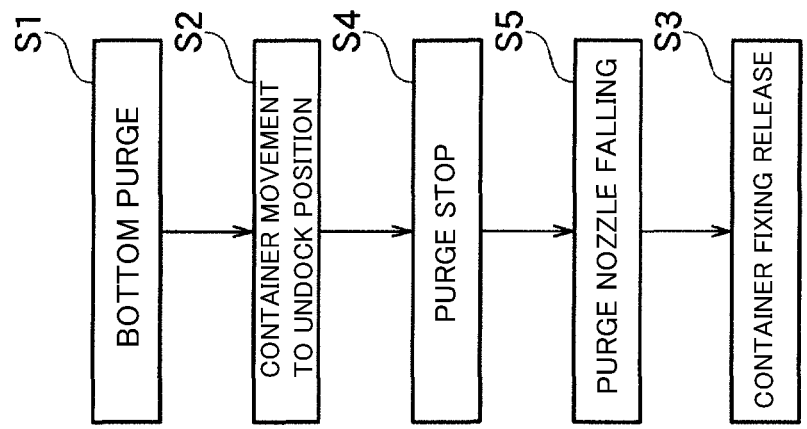
FIG. 6A to FIG. 6C are a flow chart showing a control example of a control means shown in FIG. 3A.
Figure 6B:
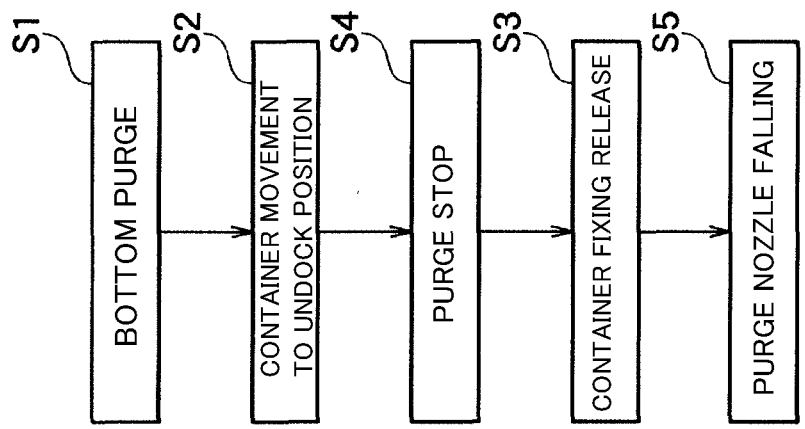
Figure 6A:
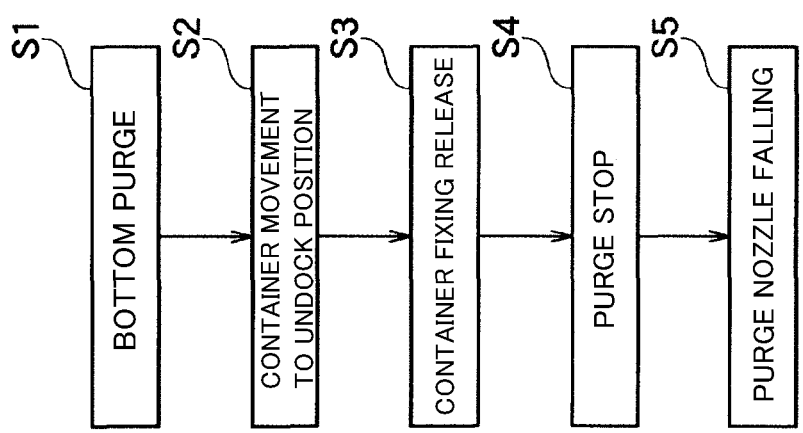

In this state, the above-mentioned bottom purge is still performed (Step S1 shown in FIG. 6A). Next, the control means 80 shown in FIG. 3A controls the clamp mechanism 50 as a fixing mechanism to perform operations opposite to ones shown in FIG. 3A to FIG. 3C mentioned above and release the fixing of the container 2 on the table 14 by the clamp mechanism 50 (Step S3 shown in FIG. 6A). The control means 80 detects the release of the fixing due to the fixing detection sensor 42, for example.

Thereafter, the control means 80 controls the control valve 23 as a gas feeding mechanism shown in FIG. 4A and FIG. 4B to stop the cleaning gas feeding (Step S4 shown in FIG. 6A). After confirming the stop by sensor or so, the control means 80 controls the gas purge unit 20 as a nozzle driving mechanism shown in FIG. 4A and FIG. 4B to move the purge nozzle 28 toward a direction (nozzle falling direction) separating from the purge port 5 (Step S5 shown in FIG. 6A).

In the load port apparatus 10 having the gas purge apparatus according to the present embodiment and the gas purge method, the purge nozzles 28 are moved toward the direction separating from the purge ports 5 after detecting the movement of the container 2 to the undock position and the stop of the feeding of the cleaning gas into the container 2. Thus, the gas purge can be performed by filling the inside of the container 2 with the cleaning gas at the unload position shown in FIG. 5A until just before the transportation. Further, the container 2 housing the processed wafers 1 is removed from the table 14 by a transportation apparatus, and the purge nozzles 28 are securely drawn into the table 14 at the arrival of the next container 2 to be placed. Thus, a placement failure does not happen to the next container 2 to be placed.

In the present embodiment, the purge nozzles 28 are moved toward the direction separating from the purge ports 5 after releasing the fixing of the container 2 and stopping the bottom purge. Thus, the purging can be continued until just before the nozzle falling, and the inside of the container 2 can be kept clean for a long time.

Second Embodiment

A load port apparatus 10 having a gas purge apparatus according to the present embodiment has the same structure and effects as the first embodiment mentioned above except for the following matters that are different from the first embodiment mentioned above.

That is, in the present embodiment, a control means 80 shown in FIG. 3A controls a table moving mechanism not illustrated to return a sealed transport container 2 housing a plurality of processed wafers 1 to an undock position together with a table 14 as shown in FIG. 5A. The control means 80 shown in FIG. 3A detects the fact that the table 14 is moved to the undock position based on detection signals from load presence sensors 44*a* and 44*b* or detection signal from the table moving mechanism (Step S2 shown in FIG. 6B).

In this state, the above-mentioned bottom purge is still performed (Step S1 shown in FIG. 6B). Next, the control means 80 shown in FIG. 3A controls a control valve 23 as a gas feeding mechanism shown in FIG. 4A and FIG. 4B to stop a cleaning gas feeding (Step S4 shown in FIG. 6B). After confirming the stop by sensor or so, the control means 80 then controls a clamp mechanism 50 as a fixing mechanism to perform operations opposite to ones shown in FIG. 3A to FIG. 3C mentioned above and release the fixing of the container 2 on the table 14 by the clamp mechanism 50 (Step S3 shown in FIG. 6B). The control means 80 detects the release of the fixing by a fixing detection sensor 42, for example.

Thereafter, the control means 80 controls a gas purge unit 20 as a nozzle driving mechanism shown in FIG. 4A and FIG. 4B to move a purge nozzle 28 toward a direction (nozzle falling direction) separating from a purge port 5 (Step S5 shown in FIG. 6B).

In the present embodiment, the fixing of the container 2 is released immediately after stopping the purging, and thus the container 2 can be quickly transported to the next step. Also, the bottom purging is stopped at the time of releasing the fixing, and thus the risk of the cleaning gas leak can be minimized.

Third Embodiment

A load port apparatus 10 having a gas purge apparatus according to the present embodiment has the same structure and effects as the first embodiment mentioned above except for the following matters that are different from the first embodiment mentioned above.

That is, in the present embodiment, a control means 80 shown in FIG. 3A controls a table moving mechanism not illustrated to return a sealed transport container 2 housing a plurality of processed wafers 1 to an undock position together with a table 14 as shown in FIG. 5A. The control means 80 shown in FIG. 3A detects the fact that the table 14 is moved to the undock position based on detection signals from load presence sensors 44*a* and 44*b* or detection signal from the table moving mechanism (Step S2 shown in FIG. 6C).

In this state, the above-mentioned bottom purge is still performed (Step S1 shown in FIG. 6C). Next, the control means 80 shown in FIG. 3A controls a control valve 23 as a gas feeding mechanism shown in FIG. 4A and FIG. 4B to stop a cleaning gas feeding (Step S4 shown in FIG. 6C). After confirming the stop by sensor or so, the control means 80 then controls a gas purge unit 20 as a nozzle driving mechanism shown in FIG. 4A and FIG. 4B to move a purge nozzle 28 toward a direction (nozzle falling direction) separating from a purge port 5 (Step S5 shown in FIG. 6C).

Thereafter, the control means 80 then controls a clamp mechanism 50 as a fixing mechanism to perform operations opposite to ones shown in FIG. 3A to FIG. 3C mentioned above and release the fixing of the container 2 on the table 14 by the clamp mechanism 50 (Step S3 shown in FIG. 6C). The control means 80 detects the release of the fixing by a fixing detection sensor 42, for example.

In the present embodiment, the fixing of the container 2 on the table 14 is released at the end, and thus the container 2 can be prevented from leaning in the separation step of the container 2. Note that, when the fixing is released with the purge nozzles 28 escalated (in the state where the nozzles 28 and the purge ports 5 are closely in contact with), the nozzles 28 may be further escalated due to reaction of the release of the fixing, and the container 2 may be vibrated up and down. Such an inconvenience can be overcome in the present embodiment Note that, the present invention is not limited to the above-mentioned embodiments, and can be variously changed within the scope thereof.

The gas purge apparatus of the present invention is applied to the load port apparatus 10 in the above-mentioned embodiments, but may be applied to other apparatus. For example, the gas purge apparatus of the present invention may be applied to a shelf, an installation stand or so for placing and storing a plurality of the containers 2. Alternatively, the gas purge apparatus of the present invention may be arranged in other apparatus or location.

The invention claimed is:

1. A gas purge apparatus capable of blowing a cleaning gas into a purging container with a purge port therethrough, comprising:
   a purge nozzle with a nozzle opening blowing out the cleaning gas;
   a table on which the purging container is detachably placed;
   a fixing mechanism capable of fixing the purging container to prevent it from moving relatively on the table and releasing this fixing;
   a nozzle driving mechanism capable of moving the purge nozzle toward the purge port and moving the purge nozzle toward a direction separating from the purge port;
   a table moving mechanism configured to move the table on which the purging container is placed to an undock position;
   a gas feeding mechanism configured to control an operation for feeding the cleaning gas into the purging container and an operation for stopping the feeding of the cleaning gas through the purge nozzle and the purge port; and
   a control means configured to control the nozzle driving mechanism to move the purge nozzle toward the direction separating from the purge port after detecting a movement of the table to the undock position and a stop of the feeding of the cleaning gas by the gas feeding mechanism.

2. The gas purge apparatus as set forth in claim 1, wherein the control means controls the nozzle driving mechanism to move the purge nozzle toward the direction separating from the purge port, provided that the control means receives a detection signal showing the release of the fixing of the purging container by the fixing mechanism and thereafter detects the stop of the feeding of the cleaning gas by the gas feeding mechanism.

3. The gas purge apparatus as set forth in claim 2, further comprising a position detecting sensor for detecting whether the purging container is placed at a predetermined position on the table, wherein
   the control means drives the fixing mechanism to fix the purging container on the table based on a normal position detecting signal detected by the position detecting sensor showing that the purging container is placed at the predetermined position on the table.

4. The gas purge apparatus as set forth in claim 1, wherein the control means controls the nozzle driving mechanism to move the purge nozzle toward the direction separating from the purge port, provided that the control means detects the stop of the feeding of the cleaning gas by the gas feeding mechanism and thereafter receives a detection signal showing the release of the fixing of the purging container by the fixing mechanism.

5. The gas purge apparatus as set forth in claim 4, further comprising a position detecting sensor for detecting whether the purging container is placed at a predetermined position on the table, wherein
   the control means drives the fixing mechanism to fix the purging container on the table based on a normal position detecting signal detected by the position detecting sensor showing that the purging container is placed at the predetermined position on the table.

6. The gas purge apparatus as set forth in claim 1, wherein
   the control means controls the fixing mechanism to release the fixing of the purging container after controlling the nozzle driving mechanism to move the purge nozzle toward the direction separating from the purge port.

7. The gas purge apparatus as set forth in claim 6, further comprising a position detecting sensor for detecting whether the purging container is placed at a predetermined position on the table, wherein
   the control means drives the fixing mechanism to fix the purging container on the table based on a normal position detecting signal detected by the position detecting sensor showing that the purging container is placed at the predetermined position on the table.

8. The gas purge apparatus as set forth in claim 1, further comprising a position detecting sensor for detecting whether the purging container is placed at a predetermined position on the table, wherein
   the control means drives the fixing mechanism to fix the purging container on the table based on a normal position detecting signal detected by the position detecting sensor showing that the purging container is placed at the predetermined position on the table.

9. A load port apparatus, comprising an installation stand and the gas purge apparatus as set forth in claim 1.

10. An installation stand for placing and storing a plurality of purging containers, comprising the gas purge apparatus as set forth in claim 1.

11. A gas purge method for blowing a cleaning gas into a purging container with a purge port therethrough, comprising the steps of:
    blowing out the cleaning gas into the purging container by bringing a nozzle opening of a purge nozzle into contact with the purge port;
    moving the purging container to an undock position; and
    moving the purge nozzle toward a direction separating from the purge port after detecting a movement of the purging container to the undock position and a stop of a feeding of the cleaning gas into the purging container, in accordance with a control means.

12. A gas purge apparatus capable of blowing a cleaning gas into a purging container with a purge port therethrough, comprising:
    a purge nozzle with a nozzle opening blowing out the cleaning gas;
    a table on which the purging container is detachably placed;
    a fixing mechanism capable of securing the purging container to prevent it from moving relative to the table and releasing the fixing mechanism;

a nozzle driving mechanism capable of moving the purge nozzle toward the purge port and moving the purge nozzle in a direction so as to separate the purge nozzle from the purge port;

a table moving mechanism configured to move the table on which the purging container is placed to a docked and an undocked position;

a gas feeding mechanism configured to control an operation for feeding the cleaning gas into the purging container and an operation for stopping the feeding of the cleaning gas through the purge nozzle and the purge port; and a control circuit configured to control the nozzle driving mechanism to move the purge nozzle in the direction to separate the purge nozzle from the purge port after detecting a movement of the table to the undocked position and to stop the feeding of the cleaning gas by the gas feeding mechanism.

13. The gas purge apparatus as set forth in claim 12, wherein the control circuit controls the nozzle driving mechanism to move the purge nozzle in the direction to separate the purge nozzle from the purge port, provided that the control circuit receives a detection signal showing the release of the securing of the purging container by the fixing mechanism and thereafter detects the stop of the feeding of the cleaning gas by the gas feeding mechanism.

14. The gas purge apparatus as set forth in claim 13, further comprising a position detecting sensor for detecting whether the purging container is placed at a predetermined position on the table, wherein the control circuit drives the fixing mechanism to secure the purging container on the table based on a normal position detecting signal detected by the position detecting sensor showing that the purging container is placed at the predetermined position on the table.

15. The gas purge apparatus as set forth in claim 12, wherein the control circuit controls the nozzle driving mechanism to move the purge nozzle in the direction to separate the purge nozzle from the purge port, provided that the control circuit detects the stop of the feeding of the cleaning gas by the gas feeding mechanism and thereafter receives a detection signal showing the release of the securing of the purging container by the fixing mechanism.

16. The gas purge apparatus as set forth in claim 15, further comprising a position detecting sensor for detecting whether the purging container is placed at a predetermined position on the table, wherein the control circuit drives the fixing mechanism to secure the purging container on the table based on a normal position detecting signal detected by the position detecting sensor showing that the purging container is placed at the predetermined position on the table.

17. The gas purge apparatus as set forth in claim 12, wherein the control circuit controls the fixing mechanism to release the securing of the purging container after controlling the nozzle driving mechanism to move the purge nozzle in the direction to separate the purge nozzle from the purge port.

18. The gas purge apparatus as set forth in claim 17, further comprising a position detecting sensor for detecting whether the purging container is placed at a predetermined position on the table, wherein the control circuit drives the fixing mechanism to secure the purging container on the table based on a normal position detecting signal detected by the position detecting sensor showing that the purging container is placed at the predetermined position on the table.

19. The gas purge apparatus as set forth in claim 12, further comprising a position detecting sensor for detecting whether the purging container is placed at a predetermined position on the table, wherein the control circuit drives the fixing mechanism to secure the purging container on the table based on a normal position detecting signal detected by the position detecting sensor showing that the purging container is placed at the predetermined position on the table.

* * * * *